(12) United States Patent
Yasunobe

(10) Patent No.: US 12,489,012 B2
(45) Date of Patent: Dec. 2, 2025

(54) SUBSTRATE TRANSPORTATION HAND, SUBSTRATE TRANSPORTATION SYSTEM, STORAGE MEDIUM, AND METHOD FOR PRODUCING ARTICLE

(71) Applicant: CANON KABUSHIKI KAISHA, Tokyo (JP)

(72) Inventor: Osamu Yasunobe, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 1029 days.

(21) Appl. No.: 17/545,219

(22) Filed: Dec. 8, 2021

(65) Prior Publication Data
US 2022/0223461 A1 Jul. 14, 2022

(30) Foreign Application Priority Data
Jan. 14, 2021 (JP) ................................. 2021-004204

(51) Int. Cl.
*H01L 21/683* (2006.01)
*G03F 7/00* (2006.01)

(52) U.S. Cl.
CPC ...... *H01L 21/6838* (2013.01); *G03F 7/70733* (2013.01)

(58) Field of Classification Search
CPC .................. H01L 21/6838; G03F 7/70733
See application file for complete search history.

(56) References Cited

U.S. PATENT DOCUMENTS

| | | | |
|---|---|---|---|
| 6,024,393 A * | 2/2000 | Shamlou ............. | H01L 21/6838 414/749.3 |
| 10,424,502 B2 * | 9/2019 | Matsunaga ....... | H01L 21/68707 |
| 2003/0053903 A1 | 3/2003 | Shanmugasundram et al. | |
| 2010/0109220 A1* | 5/2010 | Musha .................. | G02F 1/1303 269/7 |
| 2010/0178139 A1 | 7/2010 | Sundar et al. | |

(Continued)

FOREIGN PATENT DOCUMENTS

| | | |
|---|---|---|
| CN | 107408527 A | 11/2017 |
| JP | H07122614 A | 5/1995 |

(Continued)

OTHER PUBLICATIONS

Office Action issued in Korean Appln. No. 10-2022-0000693, mailed on Jul. 30, 2024. English translation provided.

(Continued)

*Primary Examiner* — Saul Rodriguez
*Assistant Examiner* — Brendan P Tighe
(74) *Attorney, Agent, or Firm* — ROSSI, KIMMS & McDOWELL LLP

(57) ABSTRACT

A substrate transportation hand for transporting a substrate includes: at least one first holding part provided on an upper surface side of the substrate transportation hand and capable of sucking and holding the substrate; at least one second holding part provided on a lower surface side of the substrate transportation hand and capable of sucking and holding the substrate; and a drive unit for independently turning on/off sucking using the first holding part and the second holding part, in order to provide a substrate transportation hand which can efficiently transport while preventing dust in accordance with a form of a substrate.

15 Claims, 4 Drawing Sheets

(56) References Cited

U.S. PATENT DOCUMENTS

| | | | |
|---|---|---|---|
| 2015/0235888 A1* | 8/2015 | Iida | G05B 19/4189 |
| | | | 414/816 |
| 2017/0025292 A1 | 1/2017 | Kotoku et al. | |
| 2018/0056525 A1* | 3/2018 | Terada | B25J 15/0616 |
| 2018/0104827 A1 | 4/2018 | Goto et al. | |
| 2018/0350652 A1* | 12/2018 | Matsuhira | H01L 21/677 |
| 2021/0347584 A1* | 11/2021 | Hashima | B65G 47/90 |
| 2023/0038276 A1* | 2/2023 | Okano | H01L 21/67253 |
| 2023/0317504 A1* | 10/2023 | Lee | H01L 21/68707 |
| | | | 74/490.01 |

FOREIGN PATENT DOCUMENTS

| | | | |
|---|---|---|---|
| JP | 2001127139 A | | 5/2001 |
| JP | 2005123642 A | | 5/2005 |
| JP | 2008147241 A | | 6/2008 |
| JP | 2010146927 A | | 7/2010 |
| JP | 2011125967 A | * | 6/2011 |
| JP | 2016039250 A | | 3/2016 |
| JP | 2018006554 A | | 1/2018 |
| JP | 2020136603 A | | 8/2020 |
| KR | 100819114 B1 | | 4/2008 |
| KR | 20090070658 A | * | 7/2009 |
| KR | 1020090070658 A | | 7/2009 |
| TW | 201034108 A | | 9/2010 |
| TW | 201539638 A | | 10/2015 |
| TW | 202006871 A | | 2/2020 |

OTHER PUBLICATIONS

Office Action issued in Taiwanese Appln. No. 110146869, dated Nov. 21, 2024. English translation provided.

Office Action issued in Taiwanese Appln. No. 110146869, dated Mar. 29, 2024. English translation provided.

* cited by examiner

SUBSTRATE TRANSPORTATION HAND, SUBSTRATE TRANSPORTATION SYSTEM, STORAGE MEDIUM, AND METHOD FOR PRODUCING ARTICLE

BACKGROUND OF THE INVENTION

Field of the Invention

The present invention relates to a substrate transportation hand, a substrate transportation system, a storage medium, a method for producing an article, and the like.

Description of the Related Art

As the demand for reducing the size of articles such as semiconductor devices and MEMS progresses, a microfabrication technique for forming a pattern of an imprint material on a substrate by curing the imprint material in a state in which a mold (mould) is in contact with the imprint material on the substrate is attracting attention. This technique is also called an imprint technique. According to imprint techniques, a fine structured body on the order of several nanometers can be formed on a substrate.

In an imprinting apparatus which forms a pattern using an imprinting technique, when an imprint material on a substrate is cured by bringing a mold which is an original sheet into contact with the imprint material at the time of forming the pattern, a pattern of the mold which is an original sheet is transferred to the substrate. Thus, the pattern can be formed on the substrate.

There is also a method for producing the mold which is an original sheet as a replica (copied article) of a master mold.

An imprinting apparatus is also used for producing the mold which is an original sheet as described above. In the mold which is an original sheet as a replica, an imprint material is disposed on a blank mold and the imprint material is cured in a state in which the master mold is in contact with the imprint material. Thus, a pattern of the master mold is transferred to the blank mold to produce the mold which is an original sheet.

Also in both imprinting apparatuses for producing an article and for producing a mold which is an original sheet, if particles (dust) are caught between an object on a side on which a pattern is transferred and the pattern to be transferred, production defects may occur or the mold which is an original sheet may be damaged. Thus, it is important not only to minimize the generation of particles, but also to produce and transport a device in a processing space or a transport space in which particles are not suspended.

Since an imprinting system is discussed herein, it is also not preferable that particles adhere to a substrate or an original sheet in a projection exposure apparatus. Moreover, in semiconductor devices, with the reduction of the size of patterns due to the high integration of integrated circuits, more stringent control of dust and chemical contamination is required.

In Japanese Patent Laid-Open No. 2005-123642, the substrate is transported by a transportation hand in a sheet state. When a substrate support block is fixed to an upper surface of the transportation hand and an outer surface of the substrate is locked, it is possible to mechanically hold the substrate on an upper surface side of the transportation hand main body. Furthermore, three suction holes are provided and a groove portion communicating with the suction holes is formed in a central portion on a lower surface side of the transportation hand main body.

When the groove portion is connected to a vacuum suction mechanism such as a vacuum pump and the vacuum suction mechanism is operated, a negative pressure is applied to the groove portion so that the substrate can be sucked and held on the lower surface side of the transportation hand. However, since a holding mechanism on the upper surface side of the transportation hand main body is in contact with an outer circumferential portion of the substrate and determines a position of the substrate, dust is likely to be generated due to contact and sliding.

An object of the present invention is to provide a substrate transportation hand capable of efficiently transporting a substrate while preventing dust in accordance with a form of the substrate.

SUMMARY OF THE INVENTION

In order to achieve the above object, a substrate transportation hand for transporting a substrate as an aspect of the present invention includes: at least one processor or circuit configured to function as: at least one first holding part provided on an upper surface side of the substrate transportation hand and capable of sucking and holding the substrate; at least one second holding part provided on a lower surface side of the substrate transportation hand and capable of sucking and holding the substrate; and a drive unit for independently turning on/off sucking using the first holding part and the second holding part.

Further features of the present invention will become apparent from the following description of embodiments with reference to the attached drawings.

DESCRIPTION OF THE EMBODIMENTS

Hereinafter, with reference to the accompanying drawings, favorable mode of the present invention will be described using Embodiments. In each diagram, the same reference signs are applied to the same members or elements, and duplicate description will be omitted or simplified.

Embodiment 1

Figure 1:
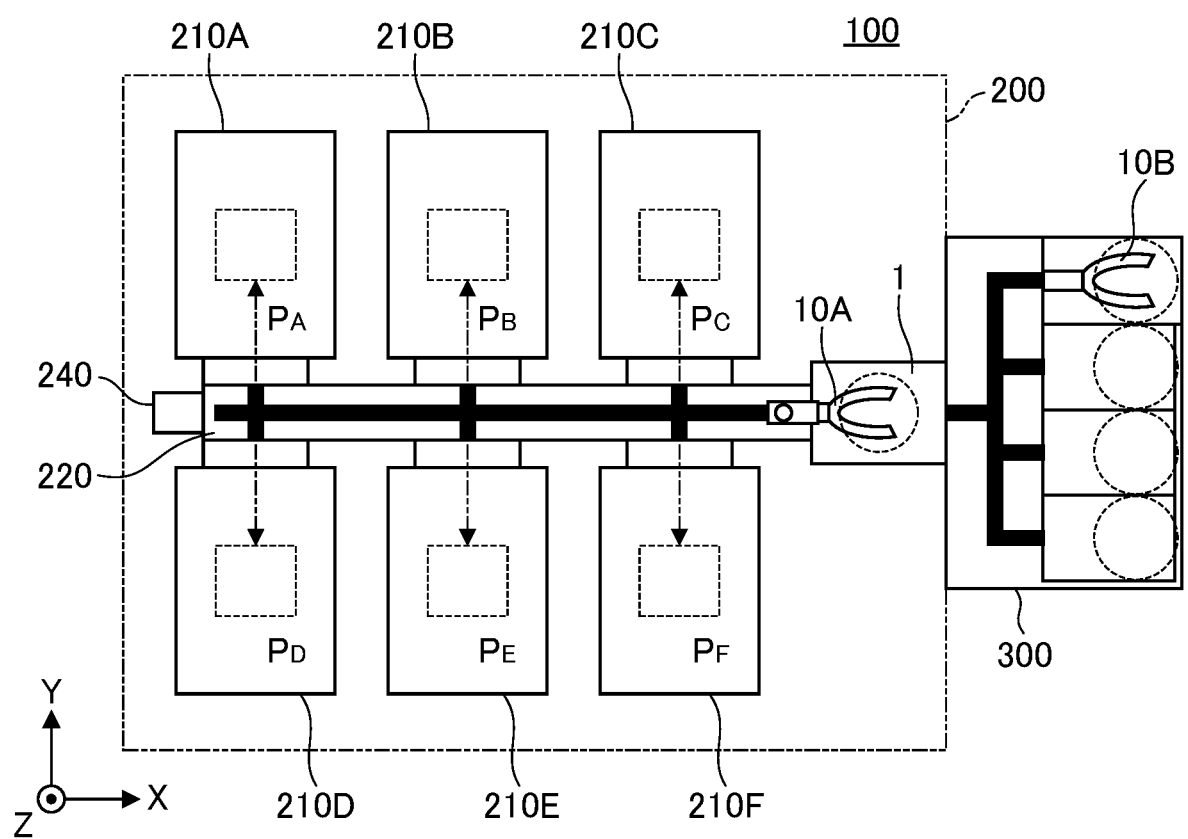
FIG. 1 is a schematic view showing the overall configuration of a substrate transportation system 100 in Embodiment 1.

First, a substrate transportation system 100 according to Embodiment 1 of the present invention will be described. The substrate transportation system 100 according to the embodiment includes a cluster type substrate processing apparatus 200 and a substrate accommodation apparatus 300. FIG. 1 is a schematic view showing the overall configuration of the substrate transportation system 100 in Embodiment 1 of the present invention.

The cluster type substrate processing apparatus 200 includes a plurality of (six as an example in the embodiment) substrate processing parts 210 (210A to 210F) and a substrate transportation region 220. The substrate processing parts 210 (210A to 210F) include, for example, a lithography apparatus. Furthermore, a substrate transportation part 10A corresponds to a substrate transportation part 10 in a state of being moved to the substrate transportation region 220 and the substrate transportation part OB corresponds to the substrate transportation part 10 in a state of being inserted into substrate accommodation boxes FP1 to FP4.

In Embodiment 1, the lithography apparatus includes a semiconductor exposing apparatus. Furthermore, the lithography apparatus also includes an imprinting apparatus which forms an uneven pattern in a substrate by coating a surface of the substrate with an imprint material and imprinting (pressing) a mold having irregularities. In addition, the lithography apparatus also includes an imprinting apparatus (flattening apparatus) which forms a flat surface by imprinting a mold having a flat surface on an imprint material on a substrate.

Figure 2A:
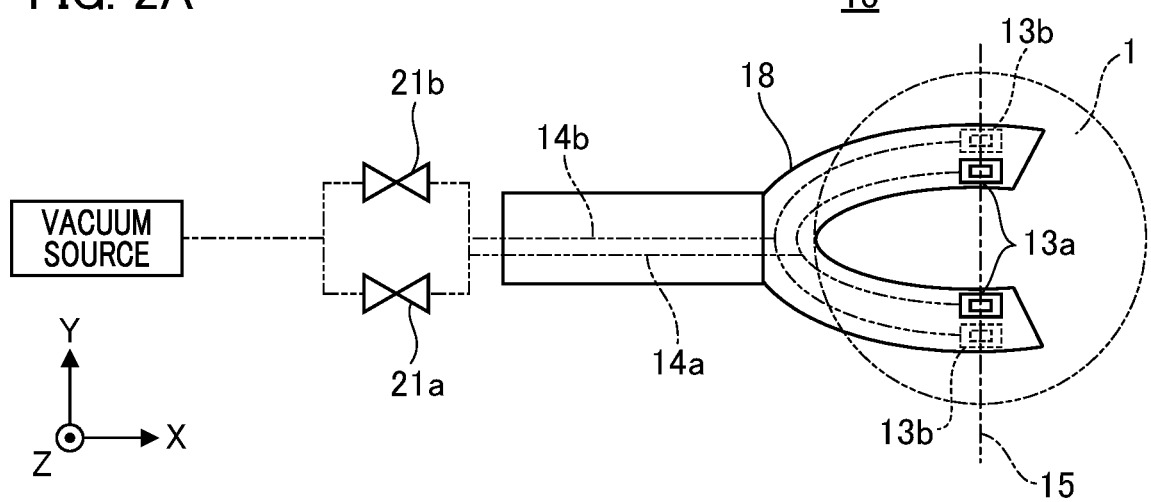
FIG. 2A is a plan view of a transportation hand in Embodiment 1.
Figure 2B:
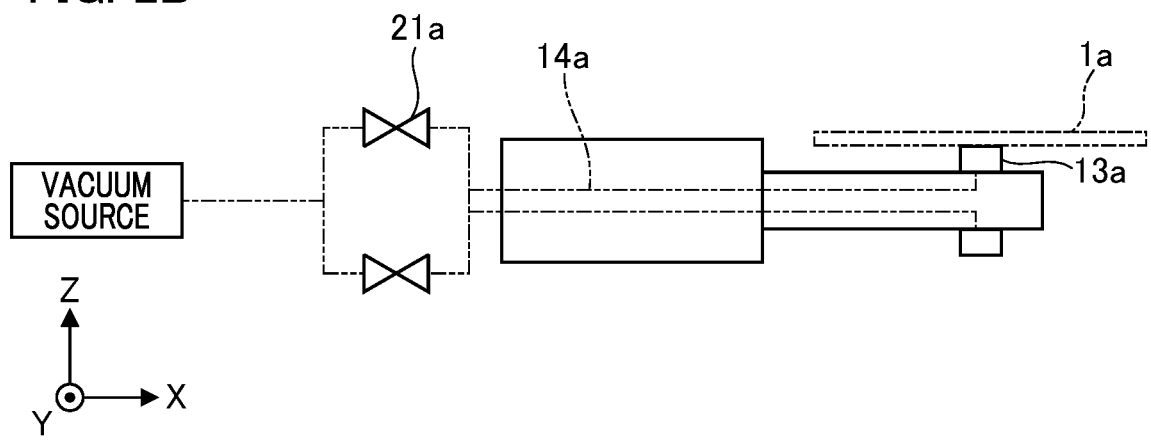
FIG. 2B is a side view of a state in which a substrate is held on an upper side of the transportation hand in Embodiment 1.
Figure 2C:
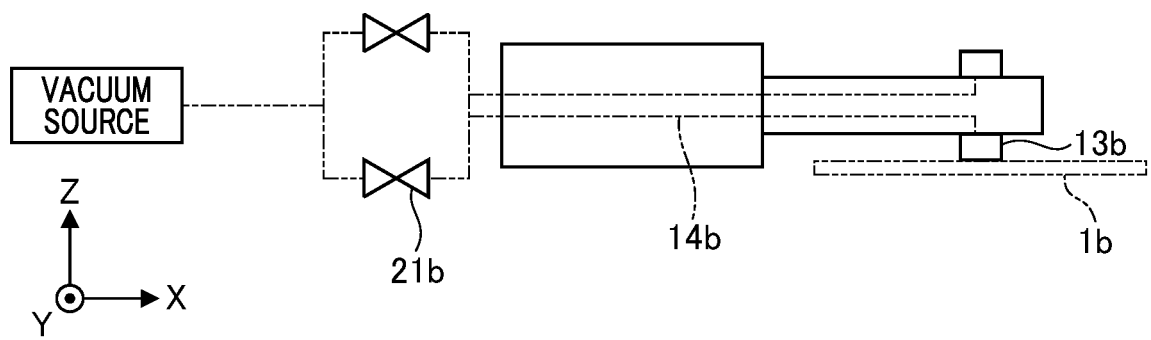
FIG. 2C is a side view of a state in which the substrate is held below the transportation hand in Embodiment 1.

FIGS. 2A to 2C are schematic views showing a configuration of the substrate transportation hand in Embodiment 1, FIG. 2A is a plan view of the transportation hand in Embodiment 1, and FIG. 2B is a side view of a state in which a substrate is held on an upper side of the transportation hand in Embodiment 1. FIG. 2C is a side view of a state in which a substrate is held on a lower side of the transportation hand in Embodiment 1.

As shown in FIGS. 2A to 2C, a substrate 1 is placed substantially horizontally so that a surface to be processed thereof faces in a Z-axis direction (upward in FIGS. 2B and 2C) or downward.

Holding parts 13a as at least one first holding part capable of sucking and holding a substrate are provided on an upper surface side of a substrate transportation hand 18.

Also, holding parts 13b as at least one second holding part capable of sucking and holding a substrate are provided on a lower surface side of the substrate transportation hand 18.

In the example of FIG. 2A, the two holding parts 3a are provided and protrude from the upper surface of the substrate transportation hand 18 and only the two holding parts 13a are in contact with the substrate 1a. In the example of FIG. 2A, the two holding parts 13b are also provided and protrude from the lower surface of the substrate transportation hand 18 and only the two holding parts 13b are in contact with the substrate 1b.

The holding parts 13a communicate with a vacuum source via a vacuum flow path 14a and an on-off valve 21a. Furthermore, the holding parts 13b communicate with the vacuum source via a vacuum flow path 14b and an on-off valve 21b. Therefore, the holding parts 13a and 13b are configured so that a substrate can be independently and selectively sucked using the on-off valves 21a and 21b. That is to say, the on-off valves 21a and 21b function as drive units for independently turning on/off the sucking using the first holding part and the second holding part.

Although an example in which the holding parts 13a and 13b utilize a vacuum suction apparatus which sucks and holds a substrate by absorbing the substrate in a vacuum will be described below, for example, an electrostatic adsorption apparatus which sucks a substrate using an electrostatic force may be utilized. Furthermore, although the two holding parts 13a and the two holding parts 13b are provided in Embodiment 1, the numbers of the holding parts 13a and 13b are not limited to two and at least one may be utilized.

Also, as shown in FIG. 2A, one of the holding parts 3a and one of the holding parts 13b are disposed at each of two distal end portions divided into two portions of the substrate transportation hand 18 so that the substrate can be sucked and held at substantially equal distances across a center of the substrate on a line 15 which passes through a diameter of a substrate.

Furthermore, as shown in FIG. 2A, the holding parts 13a and the holding parts 13b are disposed at positions shifted from each other when viewed in the Z-axis direction (upper surface side of the substrate transportation hand). The vacuum flow paths 14a and 14b are also disposed to be deviated so that the vacuum flow paths 14a and 14b and the substrate transportation hand 18 (particularly, the distal end portions thereof) do not overlap when viewed in the Z-axis direction.

With this configuration, also when the holding parts 13a and the holding parts 13b are provided on the front and back surfaces of the substrate transportation hand 18, the distal end portions of the substrate transportation hand 18 can be made sufficiently thin and the configuration of the substrate accommodation apparatus 300 can be made compact. Moreover, when a substrate is sucked and held using the holding parts 13a or the holding parts 13b, the substrate can be held efficiently and in a well-balanced manner. Furthermore, since there is no mechanism for mechanically holding the substrate, rotation mechanism, and the like, it is difficult for particles to be generated.

Figure 3B:
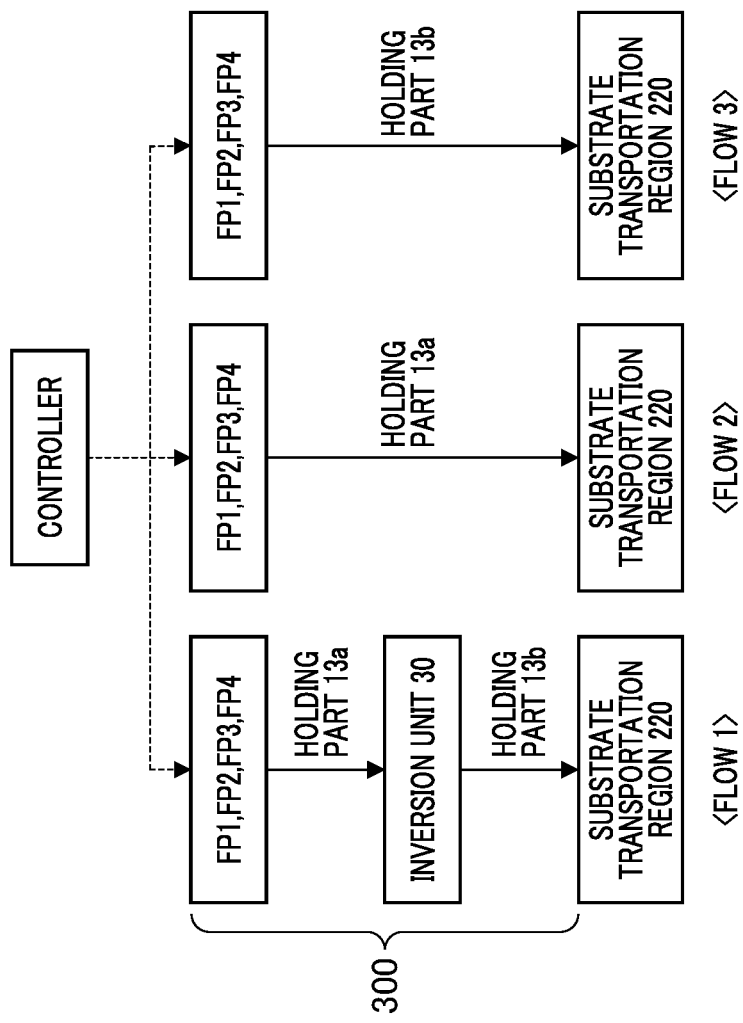
FIG. 3A is a diagram showing an example of a configuration of a substrate accommodation apparatus 300 in Embodiment and FIG. 3B is a flowchart for describing an example of an operation in Embodiment 1.
Figure 3A:
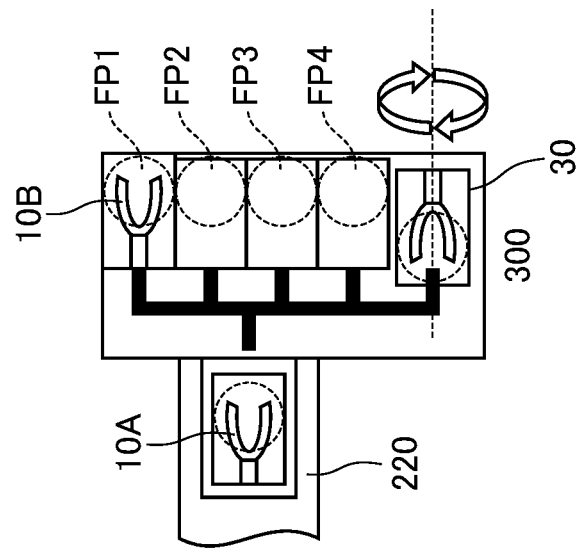

FIG. 3A is a diagram showing an example of a configuration of the substrate accommodation apparatus 300 in Embodiment 1 and FIG. 3B is a flowchart for describing an example of an operation in Embodiment 1.

In FIG. 3A, the substrate accommodation boxes FP1 to FP4 are placed and an inversion unit 30 for inverting the front surface and the back surface of the substrate 1 which is selectively held by the substrate transportation hand is provided on the substrate accommodation apparatus 300.

Also, as shown in FIG. 3B, the substrate transportation part 10B holds the substrate 1 accommodated in any of the substrate accommodation boxes FP1 to FP4 and carries the substrate 1 to the substrate transportation region 220 in accordance with a command of a controller.

(Regarding Flow 1)

A substrate transportation operation of Flow 1 in the flowchart of FIG. 3B will be described.

One substrate 1 is selected from any of a plurality of substrates 1 accommodated in the substrate accommodation boxes FP1 to FP4 and the back surface of the substrate 1 is sucked and held using the holding parts 13a formed on the upper surface of the substrate transportation hand 18 in the substrate transportation part 10B.

Subsequently, the substrate 1 is handed over to the inversion unit 30 and the front surface and the back surface of the substrate are inverted. Subsequently, an upper surface of the substrate in which the front surface and the back surface thereof have been inverted is sucked and held using the holding parts 13b formed on the lower surface of the substrate transportation hand 18 in the substrate transportation part 10B and the substrate 1 is transported to the substrate transportation region 220.

The substrate 1 transported to the substrate transportation region 220 is transported to any of the substrate processing parts 210A to 210F by the substrate transportation part 10A, and for example, a substrate processing step such as an imprint process is performed.

(Regarding Flow 2)

A substrate transportation operation of Flow 2 in the flowchart of FIG. 3B will be described.

One substrate 1 is selected from any of a plurality of substrates 1 accommodated in the substrate accommodation boxes FP1 to FP4, the back surface of the substrate 1 is sucked and held using the holding parts 13a formed on the upper surface of the substrate transportation hand 18 in the substrate transportation part 10B, and the substrate 1 is transported to the substrate transportation region 220.

After that, the substrate 1 transported to the substrate transportation region 220 is transported to any of the substrate processing parts 210A to 210F by the substrate transportation part 10A and processed.

(Regarding Flow 3)

A substrate transportation operation of Flow 3 in the flowchart of FIG. 3B will be described.

One substrate 1 is selected from any of a plurality of substrates 1 accommodated in the substrate accommodation boxes FP1 to FP4, the front surface of the substrate 1 is sucked and held using the holding parts 13b formed on the lower surface of the substrate transportation hand 18 in the substrate transportation part 10B, and the substrate 1 is transported to the substrate transportation region 220. Furthermore, the substrate 1 transported to the substrate transportation region 220 is transported to any of the substrate processing parts 210A to 210F by the substrate transportation part 10A and processed.

Embodiment 2

A substrate transportation system 100 according to Embodiment 2 of the present invention will be described below with reference to FIGS. 4A and 4B.

Figure 4A:
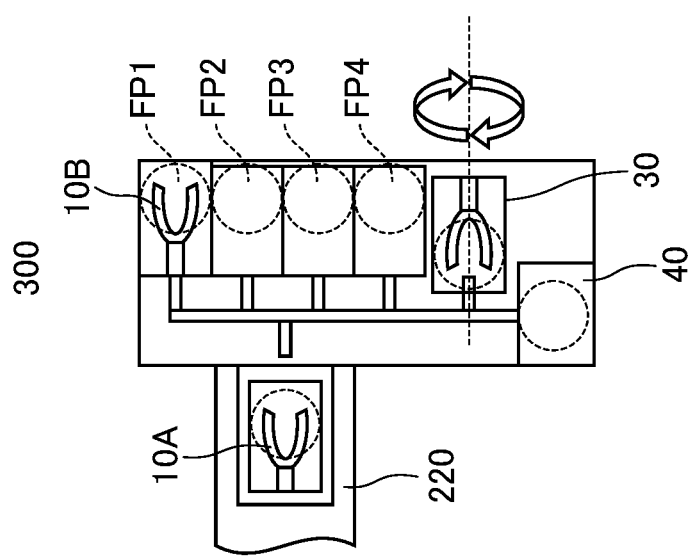
FIG. 4A is a diagram showing an example of a configuration of a substrate accommodation apparatus 300 in Embodiment 2 and FIG. 4B is a flowchart for describing an example of an operation in Embodiment 2.
Figure 4B:
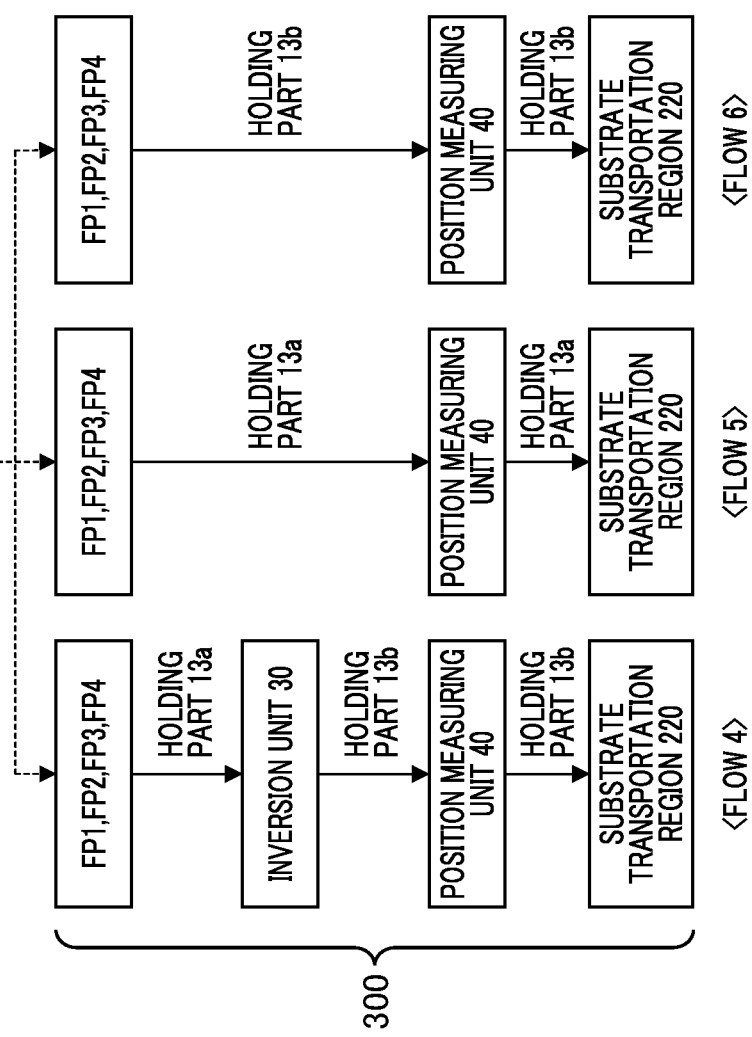

FIG. 4A is a diagram showing an example of a configuration of a substrate accommodation apparatus 300 in Embodiment 2 and FIG. 4B is a flowchart for describing an example of an operation in Embodiment 2.

In FIGS. 4A and 4B, the substrate accommodation apparatus 300 includes substrate accommodation boxes FP1 to 4 and an inversion unit 30 of a substrate 1 and a position measuring unit 40 for measuring and correcting the misalignment of a substrate.

As shown in the flowchart of FIG. 4B, a substrate transportation part 10B holds a substrate 1 accommodated in any of substrate accommodation boxes FP1 to FP4 and carries the substrate 1 to a substrate transportation region 220 in accordance with a command of a controller.

(Regarding Flow 4)

A substrate transportation operation of Flow 4 in the flowchart of FIG. 4B will be described.

One substrate 1 is selected from any of a plurality of substrates 1 accommodated in the substrate accommodation boxes FP1 to FP4, and the back surface of the substrate 1 is sucked and held using holding parts 3a formed on an upper surface of a substrate transportation hand 18 in the substrate transportation part 10B.

Subsequently, the substrate 1 is handed over to the inversion unit 30 and the front surface and the back surface of the substrate are inverted. Subsequently, an upper surface of the substrate in which the front surface and the back surface thereof have been inverted is sucked and held using the holding parts 13b provided on the lower surface of the substrate transportation hand 18 in the substrate transportation part 10B.

Also, a position measuring unit 40 measures an error due to the inversion unit 30 and the misalignment occurring when the substrate 1 is transported from the holding parts 13a to the holding parts 13b and corrects the shifting of a holding position of the substrate using the holding parts 13b. Thus, the holding parts 13b transport the substrate 1 to a substrate transportation region 220. The substrate 1 transported to the substrate transportation region 220 is transported to any of substrate processing parts 210A to 210F by a substrate transportation part 10A and processed.

(Regarding Flow 5)

A substrate transportation operation of Flow 5 in the flowchart of FIG. 4B will be described.

One substrate 1 is selected from any of a plurality of substrates 1 accommodated in the substrate accommodation boxes FP1 to FP4, and the back surface of one substrate 1 is sucked and held using the holding parts 13a formed on the upper surface of the substrate transportation hand 18 in the substrate transportation part 10B.

Also, after the misalignment of the substrate is corrected using the position measuring unit 40, the substrate 1 is transported to the substrate transportation region 220. After that, the substrate 1 transported to the substrate transportation region 220 is transported to any of the substrate processing parts 210A to 210F by the substrate transportation part 10A and processed.

(Regarding Flow 6)

A substrate transportation operation of Flow 6 in the flowchart of FIG. 4B will be described.

One substrate 1 is selected from any of a plurality of substrates 1 accommodated in the substrate accommodation boxes FP1 to FP4, and the front surface of the substrate 1 is sucked and held using the holding parts 13b formed on the lower surface of the substrate transportation hand 18 in the substrate transportation part 10B. Furthermore, after the misalignment is corrected using the position measuring unit 40, the substrate 1 is transported to the substrate transportation region 220. The substrate 1 transported to the substrate transportation region 220 is transported to any of the substrate processing parts 210A to 210F by the substrate transportation part 10A and processed.

In this way, in the substrate transportation system 100 in Embodiment 2, regardless of whether a substrate is a substrate whose surface to be processed faces upward or a substrate whose surface to be processed faces downward, high-precision and high-throughput processing is possible while preventing the adhesion of dust.

Although the cluster type substrate processing apparatus having the plurality of processing parts has been described in Embodiment 1 and Embodiment 2, also with a single substrate processing apparatus having only one processing part, the effects of the above-described embodiments can be sufficiently obtained.

As described above, according to the substrate transportation hand of the embodiments, it is possible to provide the substrate transportation system in which both high productivity and high accuracy are achieved.

It is preferable that materials of a vacuum flow path 14 and the substrate transportation hand 18 in the above-described embodiments be conductive ceramics. Furthermore, it is preferable that the apparatus of the present invention be connected to the same ground as the ground of the cluster type substrate processing apparatus 200 or the substrate accommodation apparatus 300. This is because, when dust is generated, it is possible to eliminate static electricity which causes the attraction of dust to the substrate.

Also, it is preferable that absorbing ports for absorbing dust be provided around the holding parts 13a and the holding parts 13b for sucking and around a distal end of the substrate transportation hand and the holding parts 13a and the holding parts 13b for sucking be configured to be able to independently perform a dust absorbing operation. It is preferable to control a dust absorbing operation so that the absorbing is continuously performed during a transportation operation, during holding of a substrate, and during handover of a substrate by the substrate transportation hand.

For example, productivity and quality at the time of producing an article such as a micro-device such as a semiconductor device and an element having a fine structure are improved using the substrate transportation hand, the substrate transportation system, the lithography apparatus, and the like according to the above-described embodiments.

A method for producing a device (semiconductor device, magnetic storage medium, liquid crystal display element, and the like) as an article will be described.

Such a production method may include a pattern forming step of forming a pattern of a mold on the front surface of a substrate (wafer, glass plate, film-like substrate, and the like) using a lithography apparatus. Here, a step of transferring a pattern of a mold may include a pattern forming step of forming a flat pattern. Furthermore, a substrate is not limited to a base material independently and may include a multilayer structure. Alternatively, a pattern forming step of exposing a pattern to a photoconductor on the substrate using a lithography device may be provided.

Such a production method further includes a step of processing a substrate before or after the pattern forming step. For example, the processing step may include a step of removing a residual film of the pattern and a developing step.

Also, well-known production steps such as a step of etching a substrate using the pattern as a mask, a step of cutting out a chip from the substrate (dicing), a step of disposing the chip on a frame and electrically connecting the chip to the frame (bonding), and a step of sealing them using a resin (molding) can be provided.

The method for producing an article using the substrate transportation hand, the substrate transportation system, the lithography apparatus, and the like in the above-described embodiments is advantageous in at least one of the performance, the quality, the productivity, and the production cost of the article because it has fewer defects due to dust as compared with the conventional method.

While the present invention has been described with reference to exemplary embodiments, it is to be understood that the invention is not limited to the disclosed exemplary embodiments. The scope of the following claims is to be accorded the broadest interpretation to encompass all such modifications and equivalent structures and functions.

In addition, as a part or the whole of the control according to this embodiment, a computer program realizing the function of the embodiment described above may be supplied to the substrate transportation hand, the substrate transportation system, or the like through a network or various storage media. Then, a computer (or a CPU, an MPU, or the like) of the substrate transportation hand, the substrate transportation system, or the like may be configured to read and execute the program. In such a case, the program and the storage medium storing the program configure the present invention.

This application claims the benefit of Japanese Patent Application No. 2021-004204 filed on Jan. 14, 2021, which is hereby incorporated by reference herein in its entirety.

What is claimed is:

1. A substrate transportation hand for transporting a substrate, comprising:
   at least one first holding part provided on an upper surface side of the substrate transportation hand and capable of sucking and holding the substrate;
   at least one second holding part provided on a lower surface side of the substrate transportation hand and capable of sucking and holding the substrate; and
   a drive unit for independently turning on/off sucking using the first holding part and the second holding part,
   wherein the first holding part is connected to a vacuum source via a first vacuum flow path, and the second holding part is connected to the vacuum source via a second vacuum flow path,
   wherein the first holding part and the second holding part are disposed at positions shifted from each other when the substrate transportation hand is viewed from the upper surface side, and
   wherein the first vacuum flow path and the second vacuum flow path are disposed at positions shifted from each other when the substrate transportation hand is viewed from the upper surface side.

2. The substrate transportation hand according to claim 1, wherein the substrate transportation hand has distal end portions divided into two portions and the first holding part and the second holding part are disposed at the distal end portions.

3. The substrate transportation hand according to claim 1, wherein the substrate transportation hand is made of conductive ceramic.

4. The substrate transportation hand according to claim 3, wherein the substrate transportation hand is grounded.

5. The substrate transportation hand according to claim 3, wherein the distal end portions of the substrate transportation hand have absorbing ports for absorbing dust, and the first holding part and the second holding part independently perform an absorbing operation.

6. The substrate transportation hand according to claim 1, wherein the drive unit includes a vacuum suction apparatus.

7. The substrate transportation hand according to claim 1, wherein the drive unit includes an electrostatic adsorption apparatus.

8. The substrate transportation hand according to claim 1, wherein the first holding part and the second holding part are respectively disposed at positions on the upper surface side of the substrate transportation hand and the lower surface side of the substrate transportation hand such that an imaginary line passing through a diameter of the substrate being transported by the hand intersects both of the first holding part and the second holding part.

9. A substrate transportation system which uses a substrate transportation hand for transporting a substrate, comprising:
   at least one first holding part provided on an upper surface side of the substrate transportation hand and capable of sucking and holding the substrate;
   at least one second holding part provided on a lower surface side of the substrate transportation hand and capable of sucking and holding the substrate;
   a drive unit for independently turning on/off sucking using the first holding part and the second holding part; and
   a controller causing, using the substrate transportation hand, one substrate to be selectively held from a substrate accommodation apparatus having a plurality of substrates accommodated therein and causing the substrate to be transported to a substrate processing apparatus, wherein the first holding part is connected to a vacuum source via a first vacuum flow path, and the second holding part is connected to the vacuum source via a second vacuum flow path, wherein the first holding part and the second holding part are disposed at positions shifted from each other when the substrate transportation hand is viewed from the upper surface side, and wherein the first vacuum flow path and the second vacuum flow path are disposed at positions shifted from each other when the substrate transportation hand is viewed from the upper surface side.

10. The substrate transportation system according to claim 9, wherein the substrate accommodation apparatus includes an inversion unit which inverts the front surface and the back surface of the substrate which is selectively held by the substrate transportation hand.

11. The substrate transportation system according to claim 9, wherein the substrate accommodation apparatus includes a position measuring unit which measures and corrects misalignment of the substrate which is selectively held by the substrate transportation hand.

12. The substrate transportation system according to claim 9, wherein the substrate processing apparatus includes at least one lithography apparatus.

13. The substrate transportation system according to claim 12, wherein the lithography apparatus includes an imprinting apparatus.

14. A non-transitory computer-readable storage medium configured to store a computer program to control a substrate transportation system configured to have:

at least one first holding part provided on an upper surface side of a substrate transportation hand and capable of sucking and holding a substrate;

a least one second holding part provided on a lower surface side of the substrate transportation hand and capable of sucking and holding the substrate;

a drive unit for independently turning on/off sucking using the first holding part and the second holding part; and a controller causing, using the substrate transportation hand, one substrate to be selectively held from a substrate accommodation apparatus having a plurality of substrates accommodated therein and causing the substrate to be transported to a substrate processing apparatus, wherein the first holding part is connected to a vacuum source via a first vacuum flow path, and the second holding part is connected to the vacuum source via a second vacuum flow path, wherein the first holding part and the second holding part are disposed at positions shifted from each other when the substrate transportation hand is viewed from the upper surface side, and wherein the first vacuum flow path and the second vacuum flow path are disposed at positions shifted from each other when the substrate transportation hand is viewed from the upper surface side.

15. A method for producing an article using a substrate transportation system, wherein the substrate transportation system includes:

at least one first holding part provided on an upper surface side of a substrate transportation hand and capable of sucking and holding a substrate;

at least one second holding part provided on a lower surface side of the substrate transportation hand and capable of sucking and holding the substrate;

a drive unit for independently turning on/off the sucking using the first holding part and the second holding part; and a controller causing, using the substrate transportation hand, one substrate to be selectively held from a substrate accommodation apparatus having a plurality of substrates accommodated therein and causing the substrate to be transported to a substrate processing apparatus, wherein the first holding part is connected to a vacuum source via a first vacuum flow path, and the second holding part is connected to the vacuum source via a second vacuum flow path, wherein the first holding part and the second holding part are disposed at positions shifted from each other when the substrate transportation hand is viewed from the upper surface side, wherein the first vacuum flow path and the second vacuum flow path are disposed at positions shifted from each other when the substrate transportation hand is viewed from the upper surface side, and wherein the method for producing an article comprising:

a substrate processing step of processing a substrate in the substrate processing apparatus using the substrate transportation system; and a step of producing an article by processing the substrate processed through the substrate processing step.

* * * * *